(12) United States Patent
Tachikawa

(10) Patent No.: US 7,259,394 B2
(45) Date of Patent: Aug. 21, 2007

(54) SOLID-STATE IMAGING DEVICE

(75) Inventor: Keishi Tachikawa, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 163 days.

(21) Appl. No.: 11/122,429

(22) Filed: May 5, 2005

(65) Prior Publication Data

US 2005/0247935 A1 Nov. 10, 2005

(30) Foreign Application Priority Data

May 10, 2004 (JP) ............................. 2004-140005

(51) Int. Cl.
*H01L 29/04* (2006.01)

(52) U.S. Cl. ...................................................... 257/59

(58) Field of Classification Search ........ 257/213–222, 257/59, 359, 72, 40, E29.151; 438/512; 348/314

See application file for complete search history.

(56) References Cited

U.S. PATENT DOCUMENTS

| | | | |
|---|---|---|---|
| 5,227,650 A | * | 7/1993 | Noguchi et al. ............ 257/239 |
| 5,990,953 A | | 11/1999 | Nakashiba |
| 6,600,512 B1 | * | 7/2003 | Kimura ...................... 348/283 |
| 6,760,073 B1 | * | 7/2004 | Nakashiba .................. 348/314 |
| 7,050,101 B2 | * | 5/2006 | Wako et al. ................ 348/314 |
| 2002/0039144 A1 | * | 4/2002 | Yamada ...................... 348/311 |

FOREIGN PATENT DOCUMENTS

JP 9-223788 8/1997

* cited by examiner

*Primary Examiner*—Nathan W. Ha
(74) *Attorney, Agent, or Firm*—Hamre, Schumann, Mueller & Larson, P.C.

(57) ABSTRACT

A vertical transfer charge-coupled device for vertically transferring signal charges, a horizontal transfer charge-coupled device for receiving and horizontally transferring the transferred signal charges, an unwanted electron eliminator, and a potential barrier between the horizontal transfer charge-coupled device and the unwanted electron eliminator are provided on a semiconductor substrate. The potential barrier includes a first n-type diffusion layer, a second n-type diffusion layer that is in contact with one end thereof, and a third n-type diffusion layer that is in contact with the other end. The second n-type diffusion layer and the third n-type diffusion layer have higher impurity concentrations than the first n-type diffusion layer. As a result, a solid-state imaging device is provided with which the ability of the unwanted electron eliminator to eliminate unwanted electrons is enhanced, without decreasing the size of the charge handled by the horizontal transfer charge-coupled device, allowing image output even with a large optical volume signal.

13 Claims, 8 Drawing Sheets

SOLID-STATE IMAGING DEVICE

BACKGROUND OF THE INVENTION

1. Field of the Invention

The present invention relates to a solid-state imaging device having a charge-coupled device (hereinafter also referred to as "CCD").

2. Description of the Related Art

With solid-state imaging devices used in consumer and professional video cameras, as well as in the digital still cameras that have undergone such amazing growth in recent years, the size of the charges handled by CCD pixel components (hereinafter also referred to simply as "pixel components") that are a result of reduced cell size has increased tremendously as cameras have become smaller and include more pixels. On the other hand, horizontal transfer CCD components that send signal charges to an amplifier (hereinafter also referred to simply as "horizontal CCD components"; in the following description the word "transfer" may be omitted as appropriate) need to have lower voltage requirements so that they can be driven by battery, and a major increase in the amount of charge handled has yet to be achieved. Consequently, this creates a situation in which an image cannot be outputted during the charge transfer of a signal produced by a large quantity of light (hereinafter also referred to as "large optical volume signal"), such as when capturing an image of a subject with high brightness, in indoor and outdoor image capture. This phenomenon will be described with reference to FIG. 9. FIG. 9 is a schematic of a common solid-state imaging device. When capturing an image of a subject with high brightness, the large amount of light generates a large quantity of electrons at the photodiodes 91 of a pixel component 93, and these overflow into a vertical CCD 92. The vertical CCD 92 is constantly performing transfer to a horizontal CCD 95, so that the horizontal CCD 95 fills up with electrons in the region 33 corresponding to the pixel component. These electrons go over the level that can be handled as a signal and thus are called unwanted electrons. At this point, unless the unwanted electrons can be eliminated quickly to an unwanted electron eliminator 96 that has been created in contact with the horizontal CCD 95, the signal charge (that is, the electrons) will completely bury the horizontal CCD 95 in the region 34 corresponding to an optical black component (hereinafter referred to as "OB component") 94, making it impossible to detect the 0 level serving as a reference signal in the camera, and preventing the output of an image.

An unwanted electron eliminator in a conventional solid-state imaging device has been disclosed in JP H9-223788A, for example. FIG. 10 is a schematic cross section of the conventional horizontal CCD component including an unwanted electron eliminator disclosed in JP H9-223788A. In FIG. 10, reference numeral 101 is an n-type semiconductor substrate, 102 is a p-type well, 103 is an n-type region that is a horizontal CCD component, 104 is an n-type region that is a buried channel of a potential barrier, 105 is an n-type region that is an unwanted electron eliminator, 106 is a p-type region that separates devices, 107 is polycrystalline silicon that serves as a first horizontal charge transfer electrode, 108 is a gate insulating film, 131 is a thick oxide film, and 130 is an insulating film. The unwanted electron eliminator and the buried channel of the horizontal charge transfer component are formed with the same impurity profile. The broken line 109 indicates the horizontal direction on the substrate surface within the regions 104 to 106.

With a conventional configuration, however, if the n-type region 103 that is a horizontal CCD component, the n-type region 104 that is a buried channel of a potential barrier, and the n-type region 105 that is an unwanted electron eliminator are merely formed with the same impurity profile, there will be a decrease in the ability to sweep away the unwanted electrons that flow in from the pixel component, making it impossible to output an image, or decreasing the amount of charge that can be handled by the horizontal CCD. This problem will be described through reference to FIGS. 11A to 11C. FIGS. 11A to 11C are schematic diagrams of the impurity distribution and potential distribution in the region along the broken line 109, going through the n-type region 103, n-type region 104, and n-type region 105 in FIG. 10. The following problems will be encountered when the impurity concentration of the n-type region 104 (hereinafter "impurity concentration" also will be referred to simply as "concentration") is relatively low. The impurity distribution 111 in FIG. 11A results when the n-type region 104 has a relatively low concentration. The potential 115 in FIG. 11B is the potential in a state in which power source voltage applied from around the solid-state imaging device has depleted the n-type region 103 and the n-type region 104, but the n-type region 105 remains undepleted. The potential drops from the potential 115 to the potential 113 when unwanted electrons 114 flow in from the pixel component in the case of a large optical volume signal. However, since the electron elimination distance 116 within the n-type region 104 is long, the unwanted electrons 114 cannot be eliminated, and the horizontal CCD corresponding to the pixel component overflows with unwanted electrons 114. Accordingly, even the horizontal CCD of the OB component fills up with the unwanted electrons 114, and consequently no image can be outputted when there is a large optical volume signal.

Meanwhile, the following problems will be encountered when the impurity concentration of the n-type region 104 is relatively high. The impurity distribution 112 in FIG. 11A results when the n-type region 104 has a relatively high concentration. The potential 117 in FIG. 11C is the potential in a state in which power source voltage applied from around the solid-state imaging device has depleted the n-type region 103 and the n-type region 104, but the n-type region 105 remains undepleted. The potential drops from the potential 117 to the potential 119 when unwanted electrons 118 flow in from the pixel component in the case of a large optical volume signal. In this case, the electron elimination distance 120 within the n-type region 104 for eliminating the unwanted electrons 118 is shorter than the above-mentioned electron elimination distance 116, and therefore poses no problem in terms of eliminating unwanted electrons. However, the potential at which signal charge can be accumulated with the horizontal CCD is only the potential 119, which means that the amount of charge that can be handled by the horizontal CCD decreases.

SUMMARY OF THE INVENTION

In order to solve the above problems with conventional techniques, the present invention provides a solid-state imaging device with which the ability of the unwanted electron eliminator to eliminate unwanted electrons is enhanced, without decreasing the size of the charge handled by the horizontal transfer charge-coupled device, allowing image output even with a large optical volume signal.

The first solid-state imaging device of the present invention comprises photodiodes arranged two-dimensionally on a semiconductor substrate, a vertical transfer CCD for vertically transferring signal charges read out from the photodiodes, a horizontal transfer CCD for receiving and horizontally transferring signal charges transferred by the vertical transfer CCD, an unwanted electron eliminator for eliminating unwanted electrons, and a potential barrier between the horizontal transfer CCD and the unwanted electron eliminator, wherein the potential barrier includes a first n-type diffusion layer that is selectively formed on the surface of the semiconductor substrate, a second n-type diffusion layer that is in contact with one end of the first n-type diffusion layer and has a higher impurity concentration than the first n-type diffusion layer, and a third n-type diffusion layer that is in contact with the other end of the first n-type diffusion layer and has a higher impurity concentration than the first n-type diffusion layer.

The second solid-state imaging device of the present invention comprises photodiodes arranged two-dimensionally on a semiconductor substrate, a vertical transfer CCD for vertically transferring signal charges read out from the photodiodes, a horizontal transfer CCD for receiving and horizontally transferring signal charges transferred by the vertical transfer CCD, an unwanted electron eliminator for eliminating unwanted electrons, and a potential barrier between the horizontal transfer CCD and the unwanted electron eliminator, wherein the potential barrier includes a first n-type diffusion layer that is selectively formed on the surface of the semiconductor substrate, and a second n-type diffusion layer that is in contact with at least one end of the first n-type diffusion layer and has a higher impurity concentration than the first n-type diffusion layer.

The third solid-state imaging device of the present invention comprises photodiodes arranged two-dimensionally on a semiconductor substrate, a vertical transfer CCD for vertically transferring signal charges read out from the photodiodes, a horizontal transfer CCD for receiving and horizontally transferring signal charges transferred by the vertical transfer CCD, an unwanted electron eliminator for eliminating unwanted electrons, and a potential barrier between the horizontal transfer CCD and the unwanted electron eliminator, wherein the potential barrier includes a first n-type diffusion layer that is formed selectively on the surface of the semiconductor substrate, a second n-type diffusion layer that is in contact with one end of the first n-type diffusion layer and has a higher impurity concentration than the first n-type diffusion layer, and a third n-type diffusion layer that is in contact with the other end of the first n-type diffusion layer and has a higher impurity concentration than the first n-type diffusion layer, the horizontal transfer CCD comprises a fourth n-type diffusion layer that is in contact with the end of the second n-type diffusion layer on the opposite side from the first n-type diffusion layer side and has a higher impurity concentration than the second n-type diffusion layer, and the unwanted electron eliminator includes a fifth n-type diffusion layer that is formed on the semiconductor substrate surface in contact with the end of the third n-type diffusion layer on the opposite side from the first n-type diffusion layer and has a higher impurity concentration than the third n-type diffusion layer.

The fourth solid-state imaging device of the present invention comprises photodiodes arranged two-dimensionally on a semiconductor substrate, a vertical transfer CCD for vertically transferring signal charges read out from the photodiodes, a horizontal transfer CCD for receiving and horizontally transferring signal charges transferred by the vertical transfer CCD, an unwanted electron eliminator for eliminating unwanted electrons, and a potential barrier between the horizontal transfer CCD and the unwanted electron eliminator, wherein the potential barrier includes a first n-type diffusion layer that is selectively formed on the surface of the semiconductor substrate, and a second n-type diffusion layer that is in contact with one end of the first n-type diffusion layer and has a higher impurity concentration than the first n-type diffusion layer, and the unwanted electron eliminator includes a third n-type diffusion layer formed in contact with the second n-type diffusion layer, and a fourth n-type diffusion layer formed so as to be in contact at one end with the second n-type diffusion layer and in contact at the other end with the third n-type diffusion layer.

The fifth solid-state imaging device of the present invention comprises photodiodes arranged two-dimensionally on a semiconductor substrate, a vertical transfer CCD for vertically transferring signal charges read out from the photodiodes, a horizontal transfer CCD for receiving and horizontally transferring signal charges transferred by the vertical transfer CCD, an unwanted electron eliminator for eliminating unwanted electrons, and a potential barrier between the horizontal transfer CCD and the unwanted electron eliminator, wherein the horizontal transfer CCD comprises a first n-type diffusion layer that is selectively formed on the surface of the semiconductor substrate, the unwanted electron eliminator comprises a second n-type diffusion layer that is selectively formed on the surface of the semiconductor substrate, and the potential barrier includes a third n-type diffusion layer that is formed selectively on the semiconductor substrate surface so as to be in contact at one end with the first n-type diffusion layer and in contact at the opposite end with the second n-type diffusion layer, and a fourth n-type diffusion layer that is formed selectively on the semiconductor substrate surface so as to be in contact at one end with the first n-type diffusion layer and in contact at the opposite end with the second n-type diffusion layer, and in contact at one of the remaining ends with the third n-type diffusion layer, and to have a higher impurity concentration than the third n-type diffusion layer.

The sixth solid-state imaging device of the present invention comprises photodiodes arranged two-dimensionally on a semiconductor substrate, a vertical transfer CCD for vertically transferring signal charges read out from the photodiodes, a horizontal transfer CCD for receiving and horizontally transferring signal charges transferred by the vertical transfer CCD, an unwanted electron eliminator for eliminating unwanted electrons, and a potential barrier between the horizontal transfer CCD and the unwanted electron eliminator, wherein the horizontal transfer CCD comprises a first n-type diffusion layer that is selectively formed on the surface of the semiconductor substrate, the unwanted electron eliminator comprises a second n-type diffusion layer that is selectively formed on the surface of the semiconductor substrate, and the potential barrier includes a third n-type diffusion layer that is selectively formed on the semiconductor substrate surface so as to be in contact at one end with the first n-type diffusion layer and in contact at the opposite end with the second n-type diffusion layer, and a fourth n-type diffusion layer that is selectively formed on the semiconductor substrate surface so as to be in contact at one end with the first n-type diffusion layer and in contact at the opposite end with the second n-type diffusion layer, and in contact at one of the remaining ends with the third n-type diffusion layer, and so that the potential during depletion is higher than that of the third n-type diffusion layer.

DESCRIPTION OF THE PREFERRED EMBODIMENTS

The solid-state imaging device of the present invention has a first n-type diffusion layer that is selectively formed on a semiconductor substrate surface, and a second n-type diffusion layer that, for example, is in contact with one end of the first n-type diffusion layer and has a higher impurity concentration than the first n-type diffusion layer. As a result, the ability of the unwanted electron eliminator to eliminate unwanted electrons is enhanced, without decreasing the size of the charge handled by the horizontal transfer charge-coupled device, allowing image output even with a large optical volume signal.

With the first and third solid-state imaging devices, the impurity concentrations of the first n-type diffusion layer, the second n-type diffusion layer, and the third n-type diffusion layer are preferably at least $1\times10^{14}$ cm$^{-3}$ and no more than $5\times10^{17}$ cm$^{-3}$, at least $1\times10^{15}$ cm$^{-3}$ and no more than $1\times10^{18}$ cm$^{3}$, and at least $1\times10^{15}$ cm$^{-3}$ and no more than $1\times10^{18}$ cm$^{-3}$, respectively.

With the second solid-state imaging device, the impurity concentrations of the first n-type diffusion layer and the second n-type diffusion layer are preferably at least $1\times10^{14}$ cm$^{-3}$ and no more than $5\times10^{17}$ cm$^{3}$, and at least $1\times10^{15}$ cm$^{-3}$ and no more than $1\times10^{18}$ cm$^{-3}$, respectively.

With the fourth solid-state imaging device, the impurity concentrations of the first n-type diffusion layer and the second n-type diffusion layer are preferably at least $1\times10^{16}$ cm$^{-3}$ and no more than $5\times10^{18}$ cm$^{-3}$, and at least $1\times10^{17}$ cm$^{-3}$ and no more than $5\times10^{19}$ cm$^{-3}$, respectively.

Preferably, the fourth n-type diffusion layer is present in an optical black component that determines the black level of an image, and is formed so as to have a higher impurity concentration than the third n-type diffusion layer.

With the fifth and sixth solid-state imaging devices, the fourth n-type diffusion layer is preferably present in an optical black component that determines the black level of an image.

Also, the impurity concentrations of the third n-type diffusion layer and the fourth n-type diffusion layer are preferably at least $1\times10^{14}$ cm$^{-3}$ and no more than $5\times10^{17}$ cm$^{-3}$, and at least $1\times10^{15}$ cm$^{-3}$ and no more than $1\times10^{18}$ cm$^{-3}$, respectively.

Figure 9:
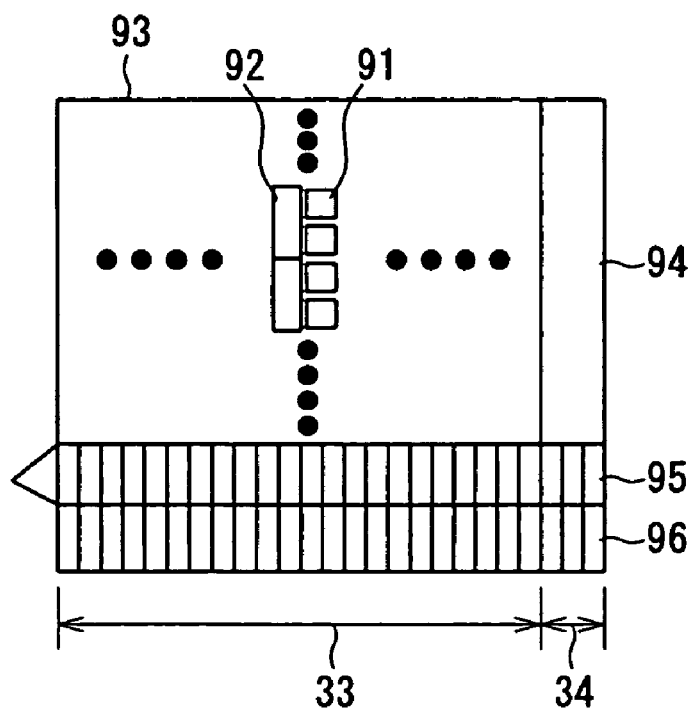
FIG. 9 is a schematic of a solid-state imaging device as in the present invention and in the past.
Figure 10:
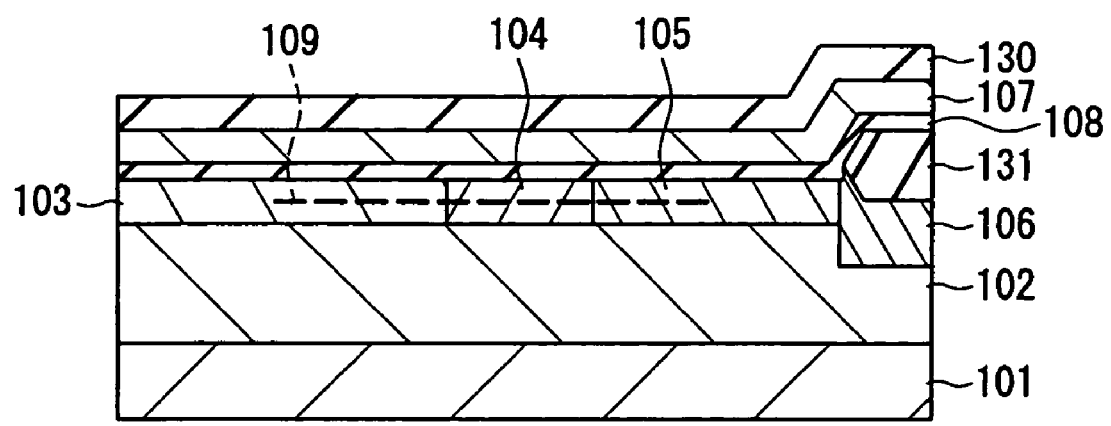
FIG. 10 is a schematic cross section of a conventional horizontal CCD component including an unwanted electron eliminator.
Figure 11A:
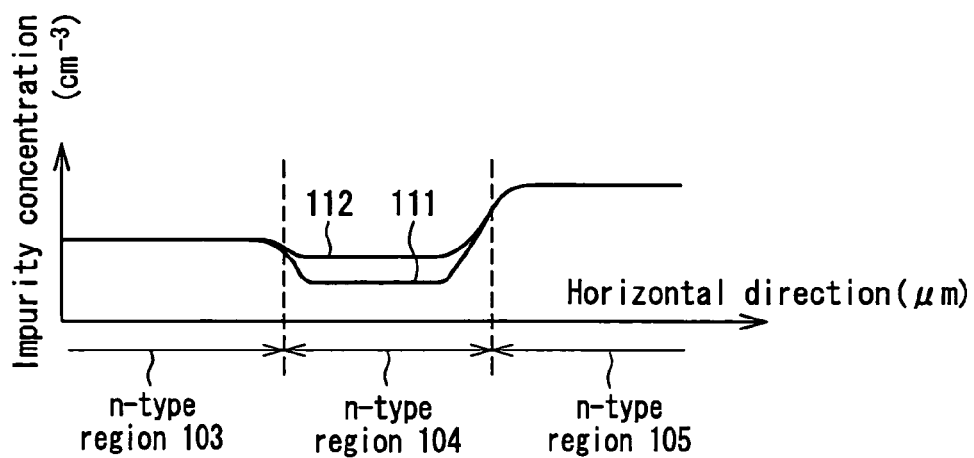
FIGS. 11A to 11C are schematics of the impurity distribution and potential distribution in the region along the broken line 109 in FIG. 10.
Figure 11B:
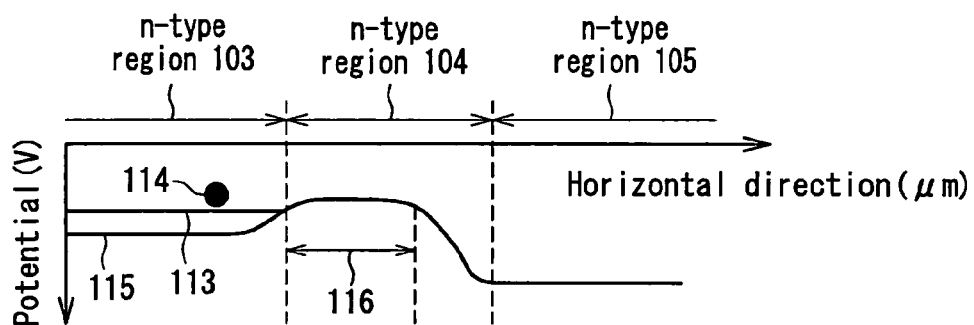
Figure 11C:
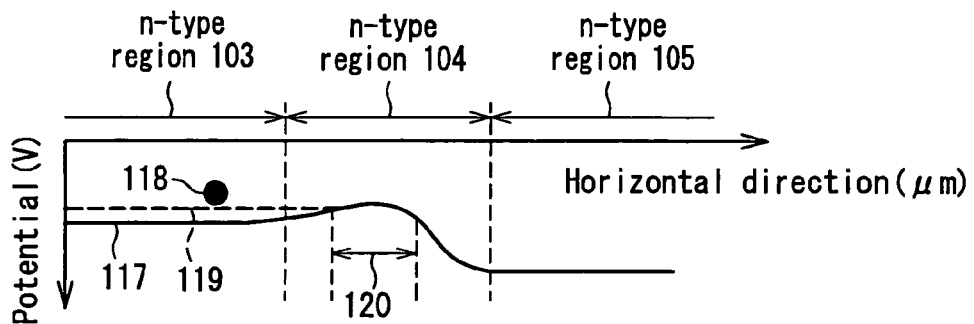

Embodiments of the present invention will now be described with reference to the drawings. The photodiodes of the pixel component in the embodiments of the present invention are the same as those shown in FIG. 9, and will therefore not be described again.

Embodiment 1

Figure 1:
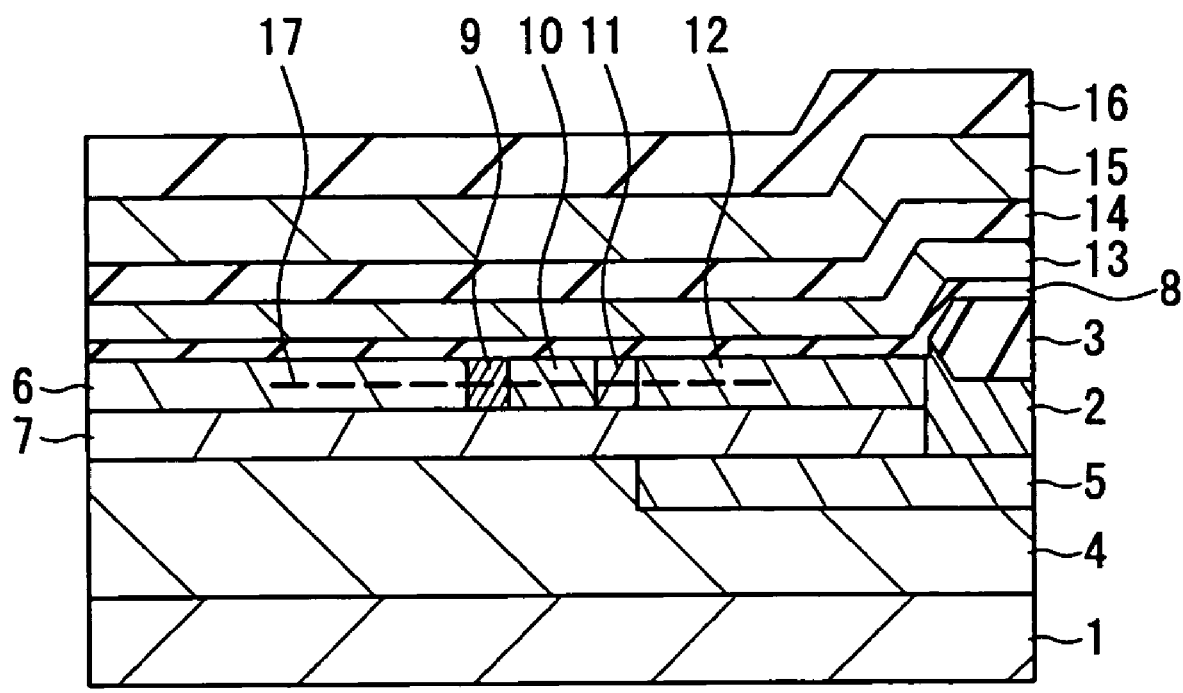
FIG. 1 is a schematic cross section of a horizontal CCD component including an unwanted electron eliminator of the solid-state imaging device in Embodiment 1 of the present invention.

FIG. 1 is a schematic cross section of a horizontal CCD component including an unwanted electron eliminator of the solid-state imaging device in Embodiment 1 of the present invention. FIG. 1 is also a cross section perpendicular to the signal charge transfer direction of the horizontal CCD. As shown in FIG. 1, a low-concentration p-type well 4 is formed over an n-type semiconductor substrate 1 (hereinafter referred to simply as "substrate 1"). The p-type well 4 has an impurity concentration set to approximately $1\times10^{14}$ cm$^{-3}$ or higher in order to suppress the backflow of electrons from the substrate 1. Setting the concentration in this way allows the horizontal drive voltage at which the backflow of electrons from the substrate 1 occurs to be 3.6 V or higher. The impurity itself can be any one used in the past. The horizontal CCD transfer channel is an n-type region 6 formed selectively over the p-type well 4. When there is a large optical volume signal, the unwanted electron eliminator used for eliminating unwanted electrons, an excess of which flow from the pixel component into the horizontal CCD channel, is an n-type region 12 formed selectively over the p-type well 4. An n-type region 10 is formed in order to determine a potential barrier that will serve as a threshold for the maximum amount of charge handled by the horizontal CCD, and a potential barrier that will serve as a threshold for the amount of elimination of excess and unwanted electrons flowing from the pixel component into the horizontal CCD channel in the event of a large optical volume signal. The n-type region 10 is formed selectively over the p-type well 4. An n-type region 9 is selectively formed over the p-type well 4 so as to link one end of the n-type region 10 with the n-type region 6 that is the horizontal CCD. An n-type region 11 is selectively formed over the p-type well 4 so as to link the other end of the n-type region 10 with the n-type region 12. The n-type region 10 has a lower concentration than the n-type region 9 and the n-type region 11. The n-type region 9 has a lower concentration than the n-type region 6. The n-type region 11 has a lower concentration than the n-type region 12. The potential narrowing effect from the n-type region 6 can be suppressed, and the potential barrier can be maintained at the n-type region 10 for eliminating unwanted electrons, by disposing the n-type region 9 in contact with the n-type region 6 that is the horizontal CCD. The potential narrowing effect from the n-type region 12 can be suppressed, and the potential barrier can be maintained at the n-type region 10, by disposing the n-type region 11 in contact with the n-type region 12 that is the unwanted electron eliminator. Since the potential narrowing effect from the n-type region 6 and the n-type region 12 can be suppressed, it is possible to reduce the width of the n-type region 10 used to form the potential barrier that is intended to eliminate unwanted electrons. Also, since the n-type region 9 and the n-type region 11 need only suppress the narrowing effect of the n-type region 6 and the n-type region 12, respectively, resistance can be kept low by raising their concentrations above that of the n-type region 10. Electrons therefore can be eliminated in less time by disposing the n-type region 9, the n-type region 10, and the n-type region 11 between the n-type region 6 that is the horizontal CCD and the n-type region 12 that is the unwanted electron eliminator. This enhances the ability to eliminate unwanted electrons and allows an image to be output even with a large optical volume signal. Also, since the potential barrier at the n-type region 10 can be kept high, there will be no decrease in the amount of charge handled by the horizontal CCD.

Also, a p-type region 7 is formed directly beneath the n-type region 6, the n-type region 9, the n-type region 10, the n-type region 11, and the n-type region 12 in order to separate the substrate 1 from the various n-type regions here. A thick oxide film 3 used for device separation is selectively formed over the substrate 1. A p-type region 2 for device separation within the substrate 1 is selectively formed directly beneath the thick oxide film 3. In order to separate the n-type region 12 and the substrate 1, a p-type region 5 is selectively formed beneath the n-type region 12 so as to be in contact with the p-type region 2 and the p-type region 7 directly beneath the p-type region 2. A first horizontal transfer gate electrode 13 is formed via a gate insulating film 8 over the n-type region 6 that is the horizontal CCD channel. An insulating film 14 is formed over the first horizontal transfer gate electrode 13. Over this is provided an optical black film 15 for preventing light from contaminating the n-type region 6. This optical black film 15 can be an aluminum (Al) film, or it can be a tungsten (W) film, tungsten silicide (WSi) film, titanium (Ti) film, or other such film composed of a high-melting point metal with good light blocking properties. A protective film 16 is further provided over the entire surface. The protective film 16 is, for example, one or more layers composed of an oxide film, nitride film, oxide-nitride film, titanium nitride film, tantalum oxide film, niobium oxide film, or the like, formed in a thickness of 100 to 2000 nm. The broken line 17 indicates the horizontal direction on the substrate 1 surface within the n-type region 6, the n-type region 9, the n-type region 10, the n-type region 11, and the n-type region 12 at the cross section between the horizontal CCD and the unwanted electron eliminator.

The n-type region 10 is formed across the entire horizontal CCD transfer channel in a width of 0.5 to 2 µm. The thickness is 0.4 µm or less, which keeps this region from being deeper than the horizontal CCD transfer channel.

The n-type region 9 is formed across the entire horizontal CCD transfer channel in a width of 0.2 to 1 µm. The thickness is 0.4 µm or less, which keeps this region from being deeper than the horizontal CCD transfer channel.

The n-type region 11 is formed across the entire horizontal CCD transfer channel in a width of 0.2 to 1 µm. The thickness is 0.4 µm or less, which keeps this region from being deeper than the horizontal CCD transfer channel.

Figure 2A:
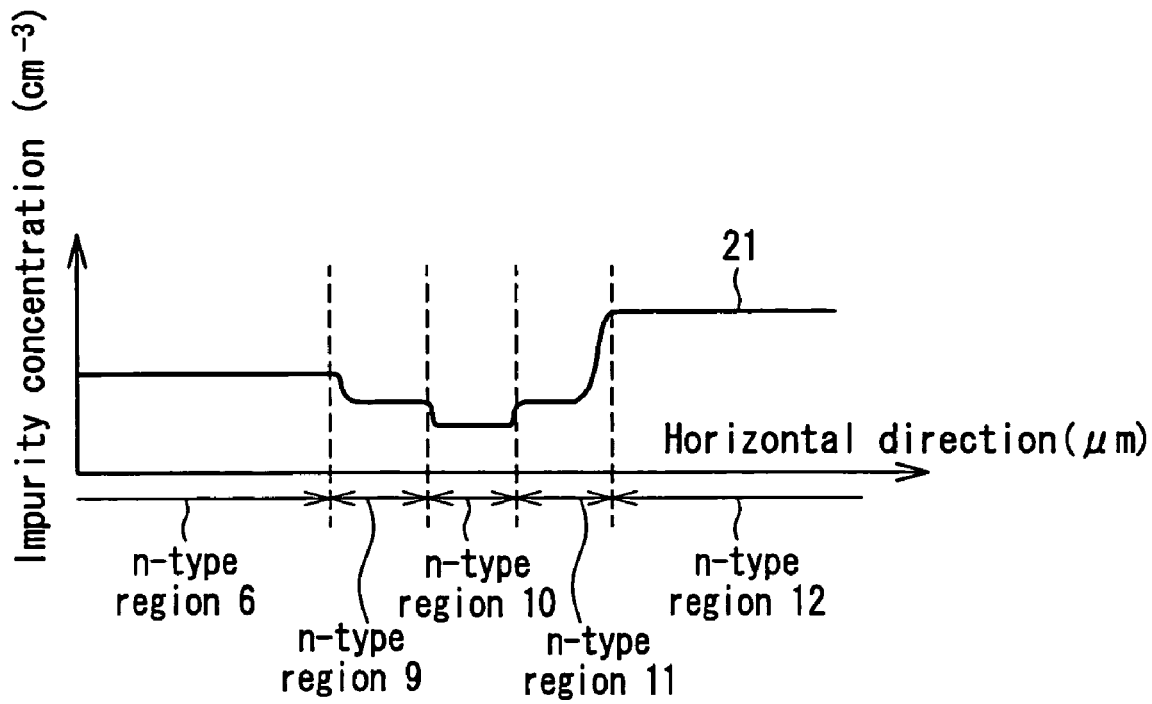
FIGS. 2A and 2B are schematics of the impurity distribution and potential distribution in the region along the broken line 17 in FIG. 1.
Figure 2B:
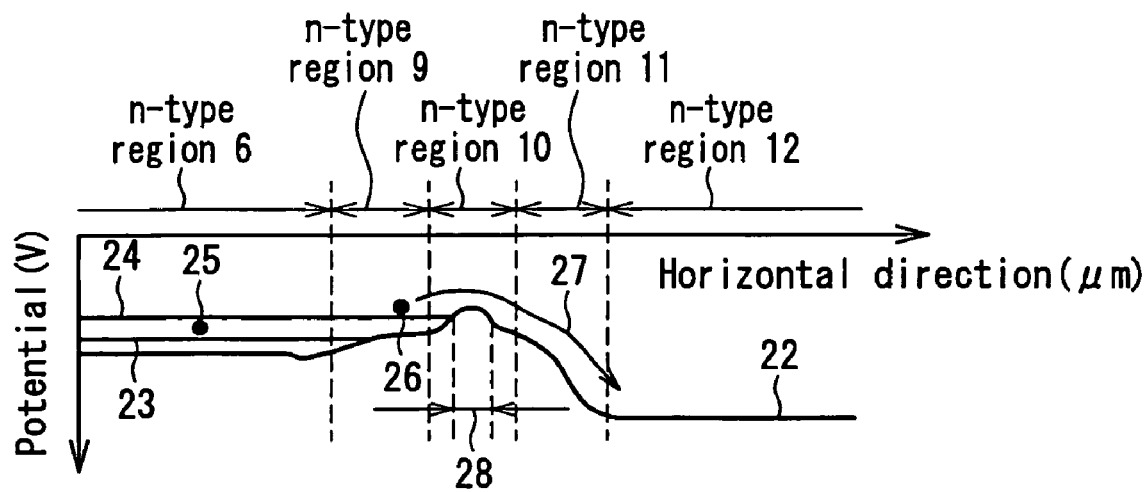

The improvement to unwanted electron elimination capability and to the amount of charged handled by the horizontal CCD as a result of this embodiment will be described with reference to FIGS. 2A and 2B. In FIGS. 2A and 2B, those constituent elements that are the same as in FIG. 1 are numbered the same and will not be described again. FIG. 2A illustrates the impurity distribution (impurity distribution 21) in the region along the broken line 17 in FIG. 1. FIG. 2B illustrates the potential distribution in the region along the broken line 17 in FIG. 1. When power source voltage from around the solid-state imaging device is applied to the n-type region 6 that is the horizontal CCD and to the n-type region 12 that is the unwanted electron eliminator, and there is no signal charge, the n-type region 6, the n-type region 9, the n-type region 10, and the n-type region 11 are in a depleted state. Since the n-type region 12 eliminates unwanted electrons, it is always in a non-depleted state. At the potential 22 in FIG. 2B, the n-type region 6 that is the horizontal CCD, the n-type region 9, the n-type region 10, and the n-type region 11 are in a depleted state, and the n-type region 12 that is the unwanted electron eliminator is in a non-depleted state. The following relationship exists in the potential φ of the n-type region 9, the n-type region 10 and the n-type region 11 between the depleted n-type region 6 and n-type region 12

$$\phi = kT/q \times \ln(Nd/ni)$$

where k is Boltzmann's constant, q is the elementary charge, Nd is the donor concentration, and ni is the true concentration.

The potential of the n-type region 6 that is the horizontal CCD gently forms a potential barrier toward the n-type region 10. Since potential modulation from the n-type region 6 can be absorbed in the n-type region 9, the potential barrier in the n-type region 10 will not be modulated and decreased. Similarly, the potential of the n-type region 12 that serves as the drain forms a potential barrier toward the n-type region 10. Since potential modulation from the n-type region 12 can be absorbed in the n-type region 11, the potential barrier in the n-type region 10 will not be modulated and decreased. Since potential modulation from the n-type region 6 and the n-type region 12 does not come into play, the width of the n-type region 10 can be reduced, and the distance 28 of the potential barrier of the n-type region 10 also can be reduced.

The potential while the signal charge 25 is being transferred in the n-type region 6 that is the horizontal CCD becomes the potential 23. This potential changes to the potential 24 when unwanted electrons 26 flow in from the pixel component in the case of a large optical volume signal. Because of the short distance 28 of the potential barrier, the unwanted electrons 26 can be swept out instantaneously to the n-type region 12 that is the unwanted electron eliminator as indicated by the arrow 27, affording better ability to eliminate the unwanted electrons 26. Also, since the impurity concentration is reduced in stages between the n-type region 6, the n-type region 9, and the n-type region 10, the unwanted electrons 26 can be sent into the n-type region 10 without greatly increasing the resistance up to the n-type region 10 where the potential barrier is formed. This affords better ability to eliminate the unwanted electrons 26.

Also, the narrowing effect can be reduced in the potential barrier of the n-type region 10, which improves the elimination of unwanted electrons. As a result, the potential barrier can be set higher in the n-type region 10, so there is no decrease in the amount of charge handled by the horizontal CCD.

As discussed above, with Embodiment 1, a first n-type diffusion layer is selectively formed on a semiconductor substrate surface, a second n-type diffusion layer is in contact with one end of the first n-type diffusion layer and has a higher impurity concentration than the first n-type diffusion layer, and a third n-type diffusion layer is in contact with the other end of the first n-type diffusion layer and has a higher impurity concentration than the first n-type diffusion layer. As a result, this enhances the unwanted electron elimination capability of the unwanted electron eliminator of the horizontal CCD and allows an image to be output even with a large optical volume signal, without reducing the amount of charge that is handled by the horizontal CCD.

In FIG. 1, reference numeral 10 corresponds to the first n-type diffusion layer, 9 to the second n-type diffusion layer, and 11 to the third n-type diffusion layer.

Embodiment 2

Figure 3:
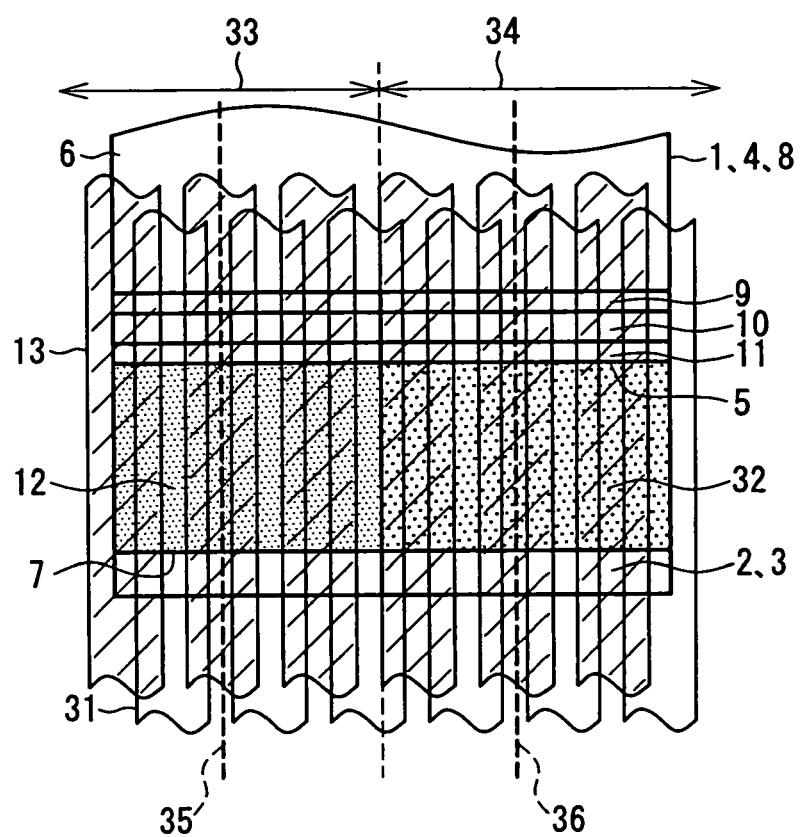
FIG. 3 is a plan view of a horizontal CCD component including an unwanted electron eliminator of the solid-state imaging device in Embodiment 2 of the present invention.
Figure 4:
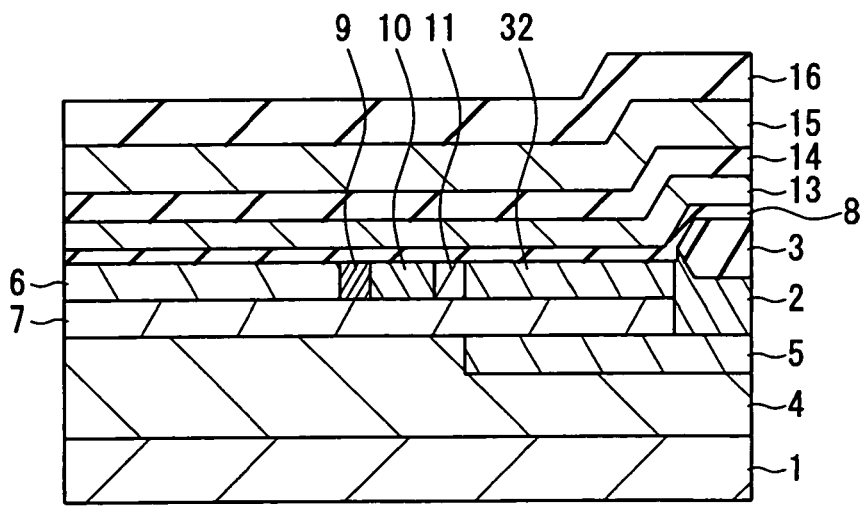
FIG. 4 is a schematic cross section along the broken line 36 in FIG. 3.

FIG. 3 is a plan view of a horizontal CCD component including an unwanted electron eliminator of the solid-state imaging device in Embodiment 2 of the present invention. A region 33 corresponds to the unwanted electron eliminator and the horizontal CCD channel in the pixel component. A region 34 corresponds to the unwanted electron eliminator and the horizontal CCD channel in the OB (optical black) component. The cross section cut along the broken line 35 corresponds to FIG. 1 discussed above. That is, FIG. 1 corresponds to a cross section perpendicular to the signal charge transfer direction in the horizontal CCD corresponding to the pixel component of the region 33 in this embodiment. Embodiment 2 will also be described through reference to FIG. 1. FIG. 4 is a schematic cross section along the broken line 36 in FIG. 3. That is, FIG. 4 is a cross section perpendicular to the signal charge transfer direction in the horizontal CCD corresponding to the OB component of the region 34. Those constituent elements in FIGS. 3 and 4 that are the same as in FIG. 1 will not be described again.

In FIGS. 3, 4, and 1, the horizontal CCD transfer channel is the n-type region 6, which is selectively formed over the p-type well 4. The unwanted electron eliminator that serves to eliminate excess and unwanted electrons that flow into the horizontal CCD channel in the case of a large optical volume signal is the n-type region 12 in the region 33 corresponding to the pixel component, and is an n-type region 32 in the region 34 corresponding to the OB component. Regarding the n-type region 12 and the n-type region 32, the n-type region 32 has a higher concentration than the n-type region 12, and the n-type region 12 and the n-type region 32 are selectively formed over the p-type well 4 in contact with each other at one end. The n-type region 10 is formed in order to determine a potential barrier that will serve as a threshold for the maximum amount of charge handled by the horizontal CCD, and a potential barrier that will serve as a threshold for the amount of elimination of excess and unwanted electrons flowing from the pixel component into the horizontal CCD channel in the event of a large optical volume signal. The n-type region 10 is selectively formed over the p-type well 4. The n-type region 9 is selectively formed over the p-type well 4 so as to link the n-type region 6 that is the horizontal CCD with one end of the n-type region 10. The n-type region 11 is selectively formed over the p-type well 4 in the region 33 and the region 34 so as to link the other end of the n-type region 10 with the n-type region 12 and the n-type region 32. The p-type region 7 is formed directly beneath the n-type region 6, the n-type region 9, the n-type region 10, the n-type region 11, and the n-type region 12 in order to separate the substrate 1 from the various n-type regions here. The thick oxide film 3 used for device separation is selectively formed over the substrate 1. The p-type region 2 for device separation within the substrate 1 is selectively formed directly beneath the thick oxide film 3. In order to separate the n-type region 12 in the pixel component of the region 33 and the n-type region 32 in the OB component of the region 34 from the substrate 1, the p-type region 5 is selectively formed beneath the n-type region 12 and the n-type region 32 so as to be in contact with the p-type region 2 and the p-type region 7 directly beneath the p-type region 2. The first horizontal transfer gate electrode 13 and a second horizontal transfer gate electrode 31 are formed via the gate insulating film 8 over the n-type region 6 that is the horizontal CCD channel.

If the n-type region 32 in the OB component of the region 34 is given a higher concentration than the n-type region 12 in the pixel component of the region 33, it will be possible to eliminate quickly any unwanted electrons that flow into the n-type region 12 that is the unwanted electron eliminator corresponding to the pixel component of the region 33, and unwanted electrons that rise up over the n-type region 9, the n-type region 10, and the n-type region 11 forming the potential barrier in the OB component of the region 34 and flow into the n-type region 32. Accordingly, the ability of the unwanted electron eliminator to eliminate unwanted electrons can be enhanced, and an image can be outputted even with a large optical volume signal. Furthermore, since the n-type region 12 and the n-type region 32 have no effect on the potential of the n-type region 10 that determines the potential barrier, there will be no decrease in the amount of charge handled by the horizontal CCD.

Also, if the n-type region 32, which has a good ability to eliminate unwanted electrons, is extended from the OB component of the region 34 to the unwanted electron eliminator and the horizontal CCD corresponding to the pixel component of the region 33, the high-concentration n-type region 32 will be disposed throughout the entire solid-state imaging device, resulting in low withstand voltage between the n-type region 32 and the substrate 1. For instance, with a solid-state imaging device used for a digital still camera with four million pixels, the horizontal CCD corresponding to the pixel component will have approximately 2300 bits, while the horizontal CCD corresponding to the OB component will have approximately 50 bits, meaning that the pixel component has a surface area more than 40 times that of the OB component. Accordingly, the reduction in withstand voltage will be worse when the n-type region 32 is extended all the way to the region corresponding to the pixel component of the region 33 than when it is disposed only in the OB component of the region 34. The only way to prevent reduction in withstand voltage between the n-type region 32 and the substrate 1 is to set the p-type well 4, the p-type region 5, and the p-type region 7 to a higher concentration, or to increase the depth between the n-type region 32 and the substrate 1. If the p-type well 4, the p-type region 5, and the p-type region 7 are set to a higher concentration, this will lead to degradation in the overall transfer efficiency in the n-type region 6 that is the horizontal CCD. If the depth is increased between the n-type region 32 and the substrate 1, this will lead to an increase in sweep voltage when the charge is swept from the photodiodes to the substrate 1. Therefore, the n-type region 32 must be limited to the region corresponding to the OB component of the region 34.

As discussed above, with Embodiment 2, a first n-type diffusion layer is selectively formed on a semiconductor substrate surface, a second n-type diffusion layer that is formed on the semiconductor substrate surface in contact with one end of the first n-type diffusion layer and has a higher impurity concentration than the first n-type diffusion layer, a third n-type diffusion layer is formed on the semiconductor substrate surface, and a fourth n-type diffusion layer is formed on the semiconductor substrate surface so as to be in contact at one end with the second n-type diffusion layer and in contact at the other end with the third n-type diffusion layer, and has a higher impurity concentration than the third n-type diffusion layer. As a result, this enhances the unwanted electron elimination capability of the unwanted electron eliminator of the horizontal CCD and allows an image to be output even with a large optical volume signal, without reducing the amount of charge that is handled by the horizontal CCD.

In FIG. 3, reference numeral 10 corresponds to the first n-type diffusion layer, 11 to the second n-type diffusion layer, 12 to the third n-type diffusion layer, and 32 to the fourth n-type diffusion layer. The end of the n-type region 32 in FIG. 3 is disposed where the region 34 and the region 33 are in contact, but what is important is that unwanted electrons can be eliminated quickly and the n-type region 6 that is the horizontal CCD of the region 34 does not fill up with unwanted electrons, and the end of the n-type region 32 may be disposed anywhere within the region 34.

Embodiment 3

Figure 5:
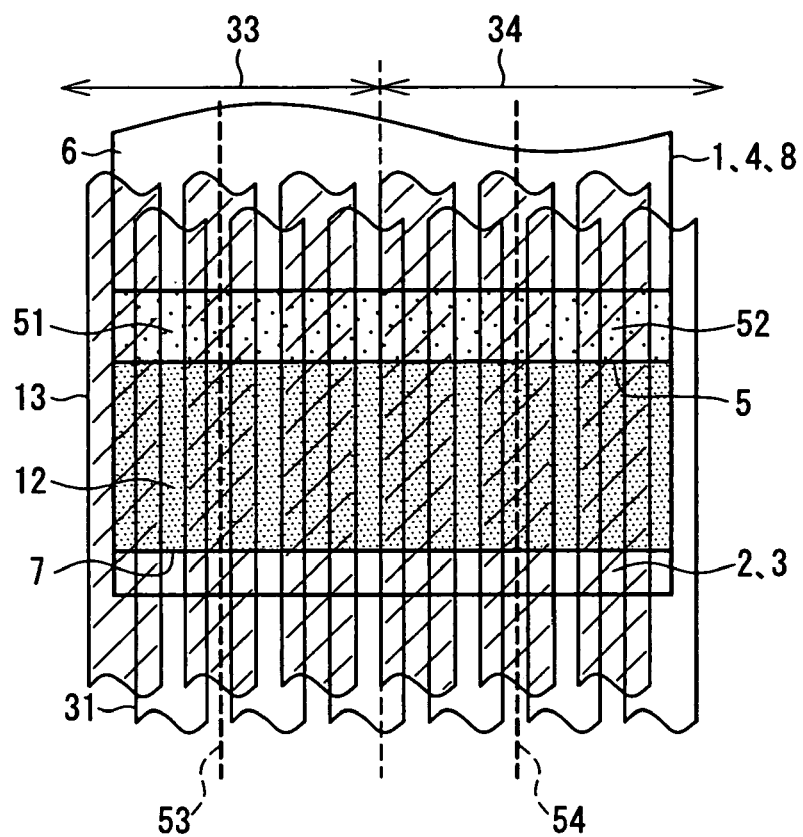
FIG. 5 is a plan view of a horizontal CCD component including an unwanted electron eliminator of the solid-state imaging device in Embodiment 3 of the present invention.
Figure 6:
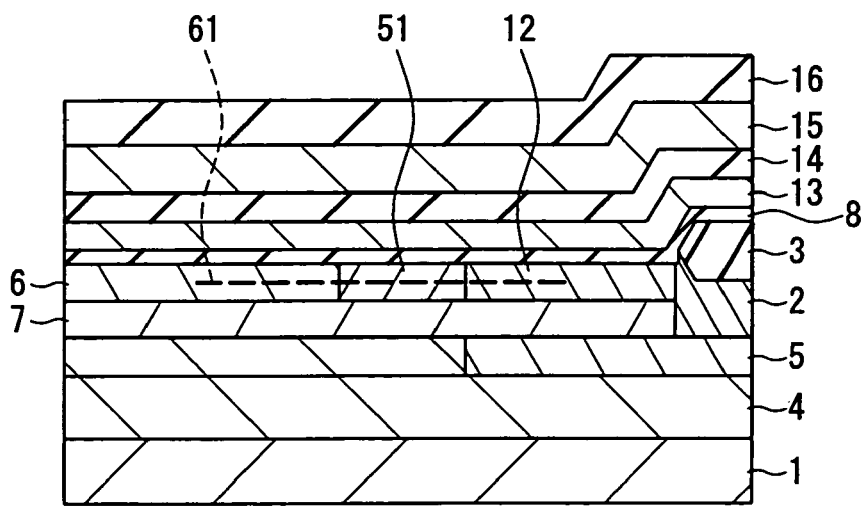
FIG. 6 is a schematic cross section along the broken line 53 in FIG. 5.
Figure 7:
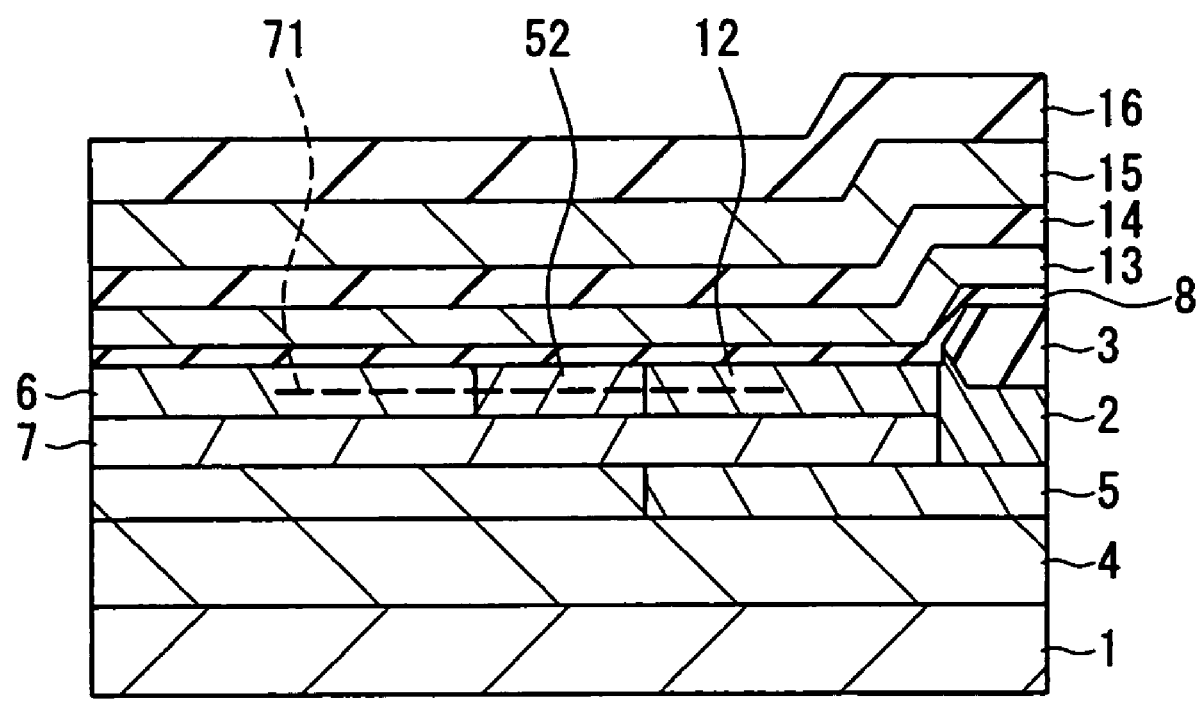
FIG. 7 is a schematic cross section along the broken line 54 in FIG. 5.

FIG. 5 is a plan view of a horizontal CCD component including an unwanted electron eliminator of the solid-state imaging device in Embodiment 3 of the present invention. FIG. 6 is a schematic cross section along the broken line 53 in FIG. 5. FIG. 7 is a schematic cross section along the broken line 54 in FIG. 5. In FIGS. 5, 6, and 7, those constituent elements that are the same as in FIGS. 1 to 4 are numbered the same and will not be described again.

In FIGS. 5, 6, and 7, the horizontal CCD transfer channel is the n-type region 6, which is formed selectively over the p-type well 4. The unwanted electron eliminator for eliminating excess and unwanted electrons flowing into the horizontal CCD channel when there is a large optical volume signal is the n-type region 12, which is formed selectively over the p-type well 4. An n-type region 51 and an n-type region 52 are formed in order to determine a potential barrier that will serve as a threshold for the maximum amount of charge handled by the horizontal CCD, and a potential barrier that will serve as a threshold for the amount of elimination of excess and unwanted electrons flowing from the pixel component into the horizontal CCD channel in the event of a large optical volume signal. In the region 33 that is the unwanted electron eliminator and the horizontal CCD corresponding to the pixel component, the region that determines the above-mentioned potential barrier is the n-type region 51, and the n-type region 51 is selectively formed over the p-type well 4 so as to be in contact at one end with the n-type region 6 and at the opposite end with the n-type region 12. In the region 34 that is the unwanted electron eliminator and the horizontal CCD corresponding to the OB component, the region that determines the above-mentioned potential barrier is the n-type region 52, and this n-type region 52 is selectively formed over the p-type well 4 so as to be in contact at one end with the n-type region 6 and at the opposite end with the n-type region 12. Since the region that determines the above-mentioned potential barrier is continuous through the horizontal CCD and the unwanted electron eliminator, the n-type region 51 and the n-type region 52 are in contact with each other at one of their remaining ends. Also, since the amount of charge handled by the horizontal CCD is ensured in the region 33, and the ability to eliminate unwanted electrons is enhanced in the region 34, the n-type region 51 is formed at a lower concentration than the n-type region 52. Also, since a potential barrier is formed with respect to the n-type region 6 and the n-type region 12, the n-type region 51 and the n-type region 52 are formed so as to have lower concentrations than the n-type region 6 and the n-type region 12. In order to separate the substrate 1 from the various n-type regions, the p-type region 7 is formed directly beneath the n-type region 6, the n-type region 51, the n-type region 52, and the n-type region 12. The thick oxide film 3 for device separation is selectively formed over the substrate 1. The p-type region 2 for device separation within the substrate 1 is selectively formed directly beneath the thick oxide film 3. In order to separate the n-type region 12 and the substrate 1, the p-type region 5 is selectively formed beneath the n-type region 12 so as to be in contact with the p-type region 2 and the p-type region 7 directly beneath the p-type region 2. The first horizontal transfer gate electrode 13 and the second horizontal transfer gate electrode 31 are formed via the gate insulating film 8 over the n-type region 6 that is the horizontal CCD channel. The broken line 61 in FIG. 6 indicates the horizontal direction on the surface of the substrate 1 within the n-type regions 6, 12, and 51. The broken line 71 in FIG. 7 indicates the horizontal direction on the surface of the substrate 1 within the n-type regions 6, 12, and 52.

Figure 8A:
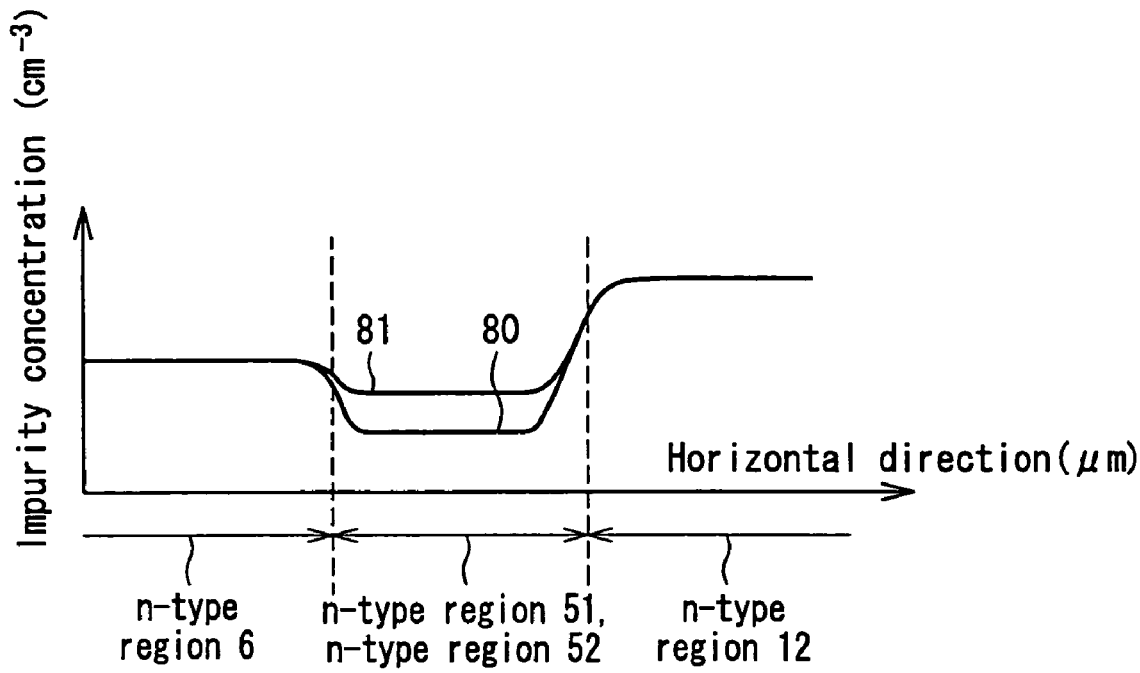
FIGS. 8A and 8B are schematics of the impurity distribution and potential distribution in the region along the broken line 61 in FIG. 6 and the broken line 71 in FIG. 7.
Figure 8B:
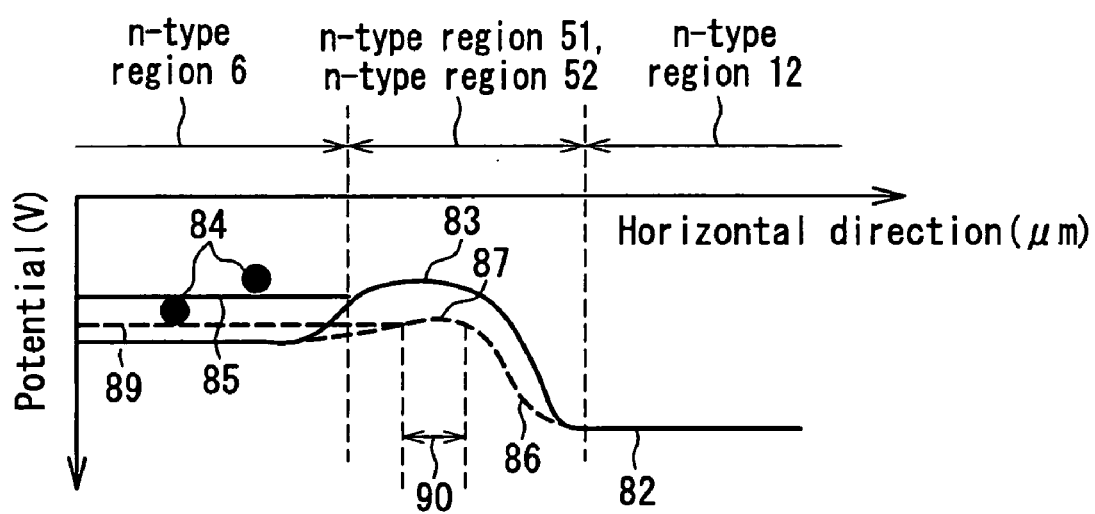

The improvement to the amount of charged handled by the horizontal CCD and the improvement to the unwanted electron sweep capability as a result of this embodiment will be described through reference to FIGS. 8A and 8B. In FIGS. 8A and 8B, those constituent elements that are the same as in FIGS. 1 to 7 will not be described again.

FIG. 8A illustrates the impurity distribution 80 in the region along the broken line 61 in FIG. 6, and the impurity distribution 81 in the region along the broken line 71 in FIG. 7. Here, the impurity concentration of the region used to determine the potential barrier between the n-type region 6 and the n-type region 12 is lower in the impurity distribution 80 than in the impurity distribution 81, and it can be seen that the region 33 in the pixel component has a lower concentration than the region 34 in the OB component. FIG. 8B is a schematic of the potential distributions in the region along the broken line 61 in FIG. 6 and in the region along the broken line 71 in FIG. 7. When power source voltage from around the solid-state imaging device is applied to the n-type region 6 that is the horizontal CCD and the n-type region 12 that is the unwanted electron eliminator, and there is no signal charge, the n-type region 6, n-type region 51, and the n-type region 52 are in a depleted state. Because it eliminates unwanted electrons, the n-type region 12 is always in a non-depleted state. The potential distribution in a state of no signal charge in the region 33 corresponding to the pixel component is the potential distribution 82. The potential distribution in a state of no signal charge in the region 34 corresponding to the OB component is the potential distribution 86. Because the n-type region 51 within the region 33 corresponding to the pixel component has a low concentration, the barrier potential within the n-type region 51 is the potential 83, resulting in a high potential barrier. Accordingly, it is possible to increase the maximum amount of charge that can be handled without causing any transfer deterioration, such as overflowing to a transfer cell to the rear in the horizontal CCD. Next, when there is a large optical volume signal and the unwanted electrons 84 flow from the pixel component into the n-type region 6 that is the horizontal CCD, the potential rises and the potential distribution 85 results. At this point, if the n-type region 6 that is the horizontal CCD corresponding to the pixel component fills up with the unwanted electrons 84, these electrons will overflow into the transfer cell to the rear and reach the region 34 corresponding to the OB component. However, since the barrier potential within the n-type region 52 in the region 34 corresponding to the OB component is set to the potential 87 so as to be lower than the potential 83, at the same time that the unwanted electrons 84 reach the region 34 corresponding to the OB component, these unwanted electrons 84 can be eliminated to the n-type region 12 that is the unwanted electron eliminator, so the potential in the n-type region 6 only drops to the potential 89. Consequently, the horizontal CCD in the region 34 corresponding to the OB component is not buried completely by the unwanted electrons 84, and an image can be output even with a large optical volume signal. Also, since the barrier potential 87 of the n-type region 52 is low, the potential narrowing effect from the n-type region 6 and the n-type region 12 is more pronounced, and the elimination distance of the unwanted electrons 84 becomes the distance 90, so the elimination distance is shorter. Accordingly, there is a further increase in the ability to eliminate unwanted electrons to the n-type region 12 that is the unwanted electron eliminator.

As discussed above, with Embodiment 3, a first n-type diffusion layer is selectively formed on a semiconductor substrate surface, a second n-type diffusion layer is selectively formed on the semiconductor substrate surface, a third n-type diffusion layer is selectively formed on a semiconductor substrate surface so as to be in contact at one end with the first n-type diffusion layer and at the opposite end with the second n-type diffusion layer, and a fourth n-type diffusion layer is selectively formed on a semiconductor substrate surface so as to be in contact at one end with the first n-type diffusion layer and at the opposite end with the second n-type diffusion layer, and in contact at one of the remaining ends with the third n-type diffusion layer, and have a lower concentration than the third n-type diffusion layer. As a result, this enhances the unwanted electron elimination capability of the unwanted electron eliminator of the horizontal CCD and allows an image to be outputted even with a large optical volume signal, without reducing the amount of charge that is handled by the horizontal CCD.

In FIG. 5, reference numeral 6 corresponds to the first n-type diffusion layer, 12 to the second n-type diffusion layer, 52 to the third n-type diffusion layer, and 51 to the fourth n-type diffusion layer.

Furthermore, Embodiment 3 illustrated a structure in which the n-type region 51 and the n-type region 52 were respectively disposed in the region 33 corresponding to the pixel component and the region 34 corresponding to the OB component, but the basic feature of this Embodiment 3 is that the potential barrier within the region 34 that is the OB component is set to be smaller than the potential barrier within the region 33 that is the pixel component. Therefore, a similar effect will be obtained when the n-type region 51 and the n-type region 52 have the same concentration, and the distance between the n-type region 6 and the n-type region 12 on the n-type region 52 side is shorter than the distance between the n-type region 6 and the n-type region 12 on the n-type region 51 side.

Also, the boundary between the n-type region 51 and the n-type region 52 in FIG. 5 was disposed at the boundary between the region 33 and the region 34, but what is important is that unwanted electrons can be eliminated quickly and the n-type region 6 that is the horizontal CCD of the region 34 does not fill up with unwanted electrons, so that the boundary between the n-type region 51 and the n-type region 52 may be disposed anywhere within the region 34.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A solid-state imaging device, comprising:
   photodiodes arranged two-dimensionally on a semiconductor substrate;
   a vertical transfer charge-coupled device for vertically transferring signal charges read out from the photodiodes;
   a horizontal transfer charge-coupled device for receiving and horizontally transferring signal charges transferred by the vertical transfer charge-coupled device;
   an unwanted electron eliminator for eliminating unwanted electrons; and
   a potential barrier between the horizontal transfer charge-coupled device and the unwanted electron eliminator,
   wherein the potential barrier includes:
   a first n-type diffusion layer that is selectively formed on the surface of the semiconductor substrate;
   a second n-type diffusion layer that is in contact with one end of the first n-type diffusion layer and has a higher impurity concentration than the first n-type diffusion layer; and
   a third n-type diffusion layer that is in contact with the other end of the first n-type diffusion layer and has a higher impurity concentration than the first n-type diffusion layer.

2. The solid-state imaging device according to claim 1, wherein the impurity concentration of the first n-type diffusion layer is at least $1 \times 10^{14}$ cm$^{-3}$ and no more than $5 \times 10^{17}$ cm$^{-3}$,
   the impurity concentration of the second n-type diffusion layer is at least $1 \times 10^{15}$ cm$^{-3}$ and no more than $1 \times 10^{18}$ cm$^{-3}$, and
   the impurity concentration of the third n-type diffusion layer is at least $1 \times 10^{15}$ cm$^{-3}$ and no more than $1 \times 10^{18}$ cm$^{-3}$.

3. A solid-state imaging device, comprising:
   photodiodes arranged two-dimensionally on a semiconductor substrate;
   a vertical transfer charge-coupled device for vertically transferring signal charges read out from the photodiodes;
   a horizontal transfer charge-coupled device for receiving and horizontally transferring signal charges transferred by the vertical transfer charge-coupled device;
   an unwanted electron eliminator for eliminating unwanted electrons; and
   a potential barrier between the horizontal transfer charge-coupled device and the unwanted electron eliminator,
   wherein the unwanted electron eliminator comprises:
   a first n-type diffusion layer that is selectively formed on the surface of the semiconductor substrate;
   a second n-type diffusion layer that is in contact with one end of the first n-type diffusion layer and has a higher impurity concentration than the first n-type diffusion layer; and
   a third n-type diffusion layer that is in contact with the other end of the first n-type diffusion layer and has a higher impurity concentration than the first n-type diffusion layer,
   the horizontal transfer charge-coupled device comprises a fourth n-type diffusion layer that is in contact with the end of the second n-type diffusion layer on the opposite side from the first n-type diffusion layer side and has a higher impurity concentration than the second n-type diffusion layer, and the unwanted electron eliminator includes a fifth n-type diffusion layer that is formed on the semiconductor substrate surface in contact with the end of the third n-type diffusion layer on the opposite side from the first n-type diffusion layer and has a higher impurity concentration than the third n-type diffusion layer.

4. The solid-state imaging device according to claim 3, wherein the impurity concentration of the first n-type diffusion layer is at least $1 \times 10^{14}$ cm$^{-3}$ and no more than $5 \times 10^{17}$ cm$^{-3}$, the impurity concentration of the second n-type diffusion layer is at least $1 \times 10^{15}$ cm$^{-3}$ and no more than $1 \times 10^{18}$ cm$^{-3}$, and the impurity concentration of the third n-type diffusion layer is at least $1 \times 10^{15}$ cm$^{-3}$ and no more than $1 \times 10^{18}$ cm$^{-3}$.

5. A solid-state imaging device, comprising:
photodiodes arranged two-dimensionally on a semiconductor substrate;
a vertical transfer charge-coupled device for vertically transferring signal charges read out from the photodiodes;
a horizontal transfer charge-coupled device for receiving and horizontally transferring signal charges transferred by the vertical transfer charge-coupled device;
an unwanted electron eliminator for eliminating unwanted electrons; and
a potential barrier between the horizontal transfer charge-coupled device and the unwanted electron eliminator,
wherein the potential barrier includes:
a first n-type diffusion layer that is selectively formed on the surface of the semiconductor substrate; and
a second n-type diffusion layer that is in contact with one end of the first n-type diffusion layer and has a higher impurity concentration than the first n-type diffusion layer, and
the unwanted electron eliminator includes:
a third n-type diffusion layer formed in contact with the second n-type diffusion layer; and
a fourth n-type diffusion layer formed so as to be in contact at one end with the second n-type diffusion layer and in contact at the other end with the third n-type diffusion layer.

6. The solid-state imaging device according to claim 5, wherein the impurity concentration of the first n-type diffusion layer is at least $1 \times 10^{16}$ cm$^{-3}$ and no more than $5 \times 10^{18}$ cm$^{-3}$, and the impurity concentration of the second n-type diffusion layer is at least $1 \times 10^{17}$ cm$^{-3}$ and no more than $5 \times 10^{19}$ cm$^{-3}$.

7. The solid-state imaging device according to claim 5, wherein the fourth n-type diffusion layer is present in an optical black component that determines the black level of an image, and is formed so as to have a higher impurity concentration than the third n-type diffusion layer.

8. A solid-state imaging device, comprising:
photodiodes arranged two-dimensionally on a semiconductor substrate;
a vertical transfer charge-coupled device for vertically transferring signal charges read out from the photodiodes;
a horizontal transfer charge-coupled device for receiving and horizontally transferring signal charges transferred by the vertical transfer charge-coupled device;
an unwanted electron eliminator for eliminating unwanted electrons; and
a potential barrier between the horizontal transfer charge-coupled device and the unwanted electron eliminator,
wherein the horizontal transfer charge-coupled device comprises a first n-type diffusion layer that is selectively formed on the surface of the semiconductor substrate,
the unwanted electron eliminator comprises a second n-type diffusion layer that is selectively formed on the surface of the semiconductor substrate, and
the potential barrier includes:
a third n-type diffusion layer that is selectively formed on the semiconductor substrate surface so as to be in contact at one end with the first n-type diffusion layer and in contact at the opposite end with the second n-type diffusion layer; and
a fourth n-type diffusion layer that is selectively formed on the semiconductor substrate surface so as to be in contact at one end with the first n-type diffusion layer and in contact at the opposite end with the second n-type diffusion layer, and in contact at one of the remaining ends with the third n-type diffusion layer, and to have a higher impurity concentration than the third n-type diffusion layer.

9. The solid-state imaging device according to claim 8, wherein the fourth n-type diffusion layer is present in an optical black component that determines the black level of an image.

10. The solid-state imaging device according to claim 8, wherein the impurity concentmtion of the third n-type diffusion layer is at least $1 \times 10^{14}$ cm$^{-3}$ and no more than $5 \times 10^{17}$ cm$^{-3}$, and the impurity concentration of the fourth n-type diffusion layer is at least $1 \times 10^{15}$ cm$^{-3}$ and no more than $1 \times 10^{18}$ cm$^{-3}$.

11. A solid-state imaging device, comprising:
photodiodes arranged two-dimensionally on a semiconductor substrate;
a vertical transfer charge-coupled device for vertically transferring signal charges read out from the photodiodes;
a horizontal transfer charge-coupled device for receiving and horizontally transferring signal charges transferred by the vertical transfer charge-coupled device;
an unwanted electron eliminator for eliminating unwanted electrons; and
a potential barrier between the horizontal transfer charge-coupled device and the unwanted electron eliminator,
wherein the horizontal transfer charge-coupled device comprises a first n-type diffusion layer that is selectively formed on the surface of the semiconductor substrate,
the unwanted electron eliminator comprises a second n-type diffusion layer that is selectively formed on the surface of the semiconductor substrate, and
the potential barrier includes:
a third n-type diffusion layer that is selectively formed on the semiconductor substrate surface so as to be in contact at one end with the first n-type diffusion layer and in contact at the opposite end with the second n-type diffusion layer; and
a fourth n-type diffusion layer that is selectively formed on the semiconductor substrate surface so as to be in contact at one end with the first n-type diffusion layer and in contact at the opposite end with the second n-type diffusion layer, and in contact at one of the remaining ends with the third n-type diffusion layer, and so that the potential during depletion is higher than that of the third n-type diffusion layer.

12. The solid-state imaging device according to claim 11, wherein the fourth n-type diffusion layer is present in an optical black component that determines the black level of an image.

13. The solid-state imaging device according to claim 11, wherein the impurity concentration of the third n-type diffusion layer is at least $1\times10^{14}$ cm$^{-3}$ and no more than $5\times10^{17}$ cm$^{-3}$, and the impurity concentration of the fourth n-type diffusion layer is at least $1\times10^{15}$ cm$^{-3}$ and no more than $1\times10^{18}$ cm$^{-3}$.

* * * * *